United States Patent

Boufnichel et al.

(10) Patent No.: US 10,797,290 B2
(45) Date of Patent: Oct. 6, 2020

(54) ASSEMBLY OF ELECTRONIC COMPONENTS

(71) Applicant: STMicroelectronics (Tours) SAS, Tours (FR)

(72) Inventors: Mohamed Boufnichel, Monnaie (FR); Julien Ladroue, Monnaie (FR)

(73) Assignee: STMicroelectronics (Tours) SAS, Tours (FR)

( * ) Notice: Subject to any disclaimer, the term of this patent is extended or adjusted under 35 U.S.C. 154(b) by 639 days.

(21) Appl. No.: 15/440,683

(22) Filed: Feb. 23, 2017

(65) Prior Publication Data

US 2018/0026249 A1 Jan. 25, 2018

(30) Foreign Application Priority Data

Jul. 21, 2016 (FR) ........................................ 16 56944

(51) Int. Cl.
*H01M 2/20* (2006.01)
*H01M 6/40* (2006.01)

(52) U.S. Cl.
CPC .............. *H01M 2/204* (2013.01); *H01M 2/20* (2013.01); *H01M 2/202* (2013.01); *H01M 6/40* (2013.01); *H01L 2225/06562* (2013.01)

(58) Field of Classification Search
CPC .......... H01M 2/20; H01M 2/204; H01M 6/40; H01M 2/202; H01L 2225/06562
See application file for complete search history.

(56) References Cited

U.S. PATENT DOCUMENTS

| 2004/0229117 | A1* | 11/2004 | Mitani | H01G 9/155 |
|---|---|---|---|---|
| | | | | 429/160 |
| 2008/0032236 | A1* | 2/2008 | Wallace | H01M 6/40 |
| | | | | 430/319 |
| 2008/0224322 | A1* | 9/2008 | Shinogi | H01L 22/10 |
| | | | | 257/777 |
| 2011/0183183 | A1 | 7/2011 | Grady et al. | |
| 2012/0001347 | A1* | 1/2012 | Lee | H01L 24/49 |
| | | | | 257/777 |
| 2012/0299555 | A1* | 11/2012 | Tam | H01M 2/0212 |
| | | | | 320/162 |
| 2015/0194697 | A1 | 7/2015 | Hung et al. | |
| 2016/0056091 | A1* | 2/2016 | Kim | H01L 23/552 |
| | | | | 257/368 |

FOREIGN PATENT DOCUMENTS

| EP | 1968115 A2 | 9/2008 |
|---|---|---|
| EP | 968115 | * 10/2008 |
| WO | WO-2014006296 A1 | 1/2014 |

OTHER PUBLICATIONS

INPI Search Report and Written Opinion for FR 1656944 dated Apr. 6, 2017 (12 pages).

* cited by examiner

*Primary Examiner* — Alexander Usyatinsky
(74) *Attorney, Agent, or Firm* — Crowe & Dunlevy

(57) ABSTRACT

Identical planar electronic components are stacked in an assembly. Each component has two contact metallizations positioned on edges of a same surface of the component. The components are stacked along a common axis. Each successive component is rotated about the common axis by a fixed angle. A value of the fixed angle is selected to position, side by side, the contact metallization of one component and the contact metallization of another next component adjacent to each other in the stack. Electrical connections are provided between two adjacent contact metallizations.

6 Claims, 4 Drawing Sheets

ASSEMBLY OF ELECTRONIC COMPONENTS

PRIORITY CLAIM

This application claims the priority benefit of French Application for Patent No. 1656944, filed on Jul. 21, 2016, the disclosure of which is hereby incorporated by reference in its entirety.

TECHNICAL FIELD

The present disclosure relates to an assembly of electronic components and more particularly to a vertical stack of electronic components.

BACKGROUND

FIGS. 1A and 1B illustrate a planar square-shaped electronic component 1. Electronic component 1 may, for example, be a microbattery.

FIG. 1A is a top view. Component 1 comprises two contact metallizations 3 and 5, for example, the positive + and negative − terminals of a microbattery. Metallizations 3 and 5 are positioned on the edge of component 1, for example, on two consecutive corners of an upper surface 7 of component 1. Contact metallizations 3 and 5 are, for example, triangular and have a top corresponding to the corner of component 1.

FIG. 1B is a side view of electronic component 1. Contact metallization 5 is positioned in a corner of upper surface 7 of component 1 and does not extend through the component. The same applies to contact metallization 3, not shown in FIG. 1B.

FIG. 2 illustrates a parallel assembly of electronic components 1 of the type shown in FIGS. 1A and 1B. The components are stacked along an axis Z orthogonal to the plane of the components, and are shifted with respect to one another by a length L, along an axis X orthogonal to axis Z and to the side of the component supporting metallizations 3 and 5. Length L is selected to expose contact metallizations 3 and 5 of each successive component 1. Contact metallizations 3 and 5 of components 1 are respectively interconnected by connections 11 and 13, for example, weld lines.

The assembly of FIG. 2 has the disadvantage of being bulky and unreliable when a large number of components 1 need to be stacked.

SUMMARY

An embodiment aims at forming an assembly of electronic components which avoids at least some of the disadvantages of existing assemblies.

An embodiment provides an assembly of electronic components enabling to stack a large number of electronic components with a low bulk.

An embodiment provides an assembly of electronic components enabling to connect the electronic components in parallel and/or in series.

Thus, an embodiment provides an assembly of identical planar electronic components having two contact metallizations positioned on edges of a same surface of each component, the components being stacked along an axis Z orthogonal to their plane, wherein each successive component is rotated around axis Z by a fixed angle, the fixed angle being selected to position side by side one of the contact metallizations of a component and one of the contact metallizations of the next component, the assembly further comprising connections between two adjacent contact metallizations.

According to an embodiment, the two contact metallizations form a positive terminal and a negative terminal of a microbattery.

According to an embodiment, the electronic components are series-connected by selecting the fixed angle to position side by side the positive terminal of a microbattery and the negative terminal of the next microbattery.

According to an embodiment, the electronic components are connected in parallel by selecting the fixed angle to position side by side the positive terminal of a microbattery and the positive terminal of the next microbattery.

According to an embodiment, the electronic components have a square or rectangular shape.

According to an embodiment, each contact metallization is positioned on one of the corners of the component.

According to an embodiment, the electronic components have a circular shape.

According to an embodiment, each contact metallization is formed on an extension extending inside of the component periphery.

According to an embodiment, each contact metallization is positioned on the edge of the component and associated with an opening intended to connect said contact metallization with a contact metallization of another component.

According to an embodiment, the connections are joined by a weld or solder.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
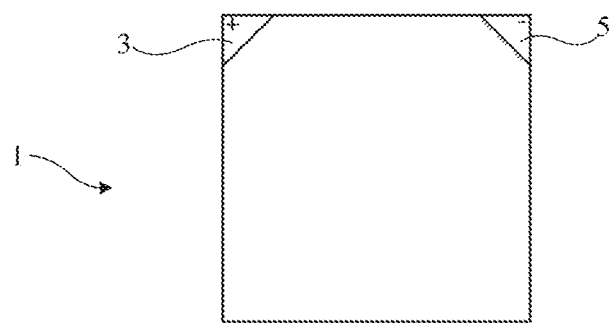
FIGS. 1A and 1B, previously described, are respective top and side views of a planar electronic component.

The same elements have been designated with the same reference numerals in the different drawings. For clarity, only those steps and elements which are useful to the understanding of the described embodiments have been shown and are detailed.

In the following description, when reference is made to terms qualifying a relative position, such as terms "top" and "upper", or to terms qualifying the orientation, such as term "vertical", reference is made to the orientation of the element considered in the drawings. Unless otherwise specified, expression "in the order of" means to within 10%, preferably to within 5%.

Figure 1B:
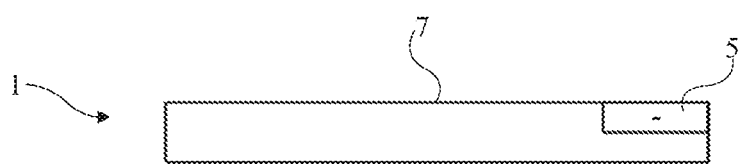
Figure 2:
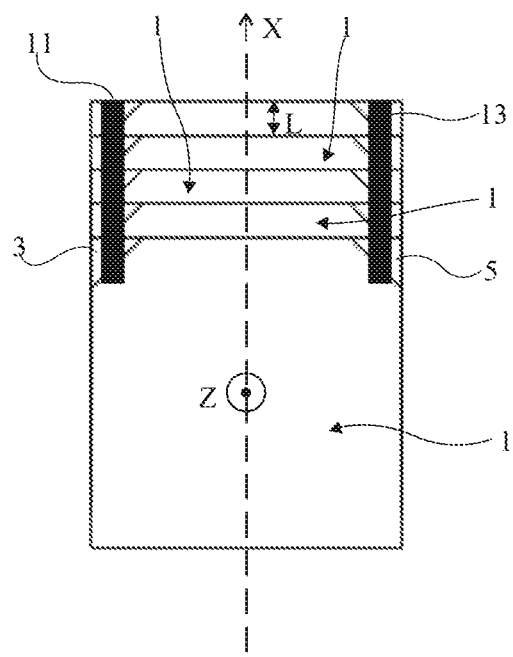
FIG. 2, previously described, is a top view of an example of assembly of electronic components of the type in FIGS. 1A and 1B.
Figure 3A:
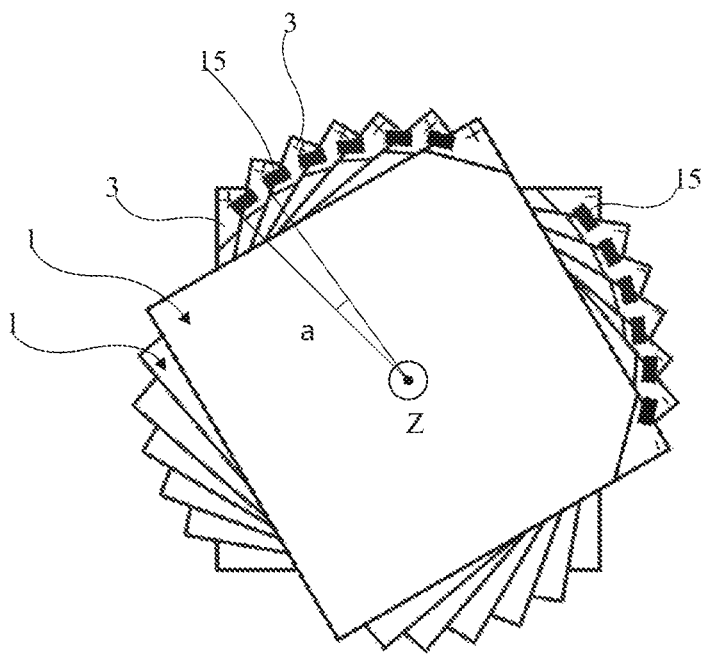
FIG. 3A is a top view of an embodiment of a parallel assembly of electronic components of the type in FIGS. 1A and 1B.

FIG. 3A is a top view of an embodiment of a parallel assembly of electronic components 1 of the type shown in relation with FIGS. 1A and 1B. Components 1 are stacked along a common axis Z, orthogonal to the plane of components 1. Axis Z is arranged at the center of the components. Each component has been submitted to a rotation about the common central axis Z by a fixed angle "a" with respect to the previous component. Contact metallizations 3 of the successive components are thus spaced apart and adjacent. Contact metallizations 3 of the successive components may be connected by a weld or solder electrical connection 15. Similarly, contact metallizations 5 of the successive components may be connected by a weld or solder 15. In this example, fixed angle "a" is in the order of 10 degrees. As shown in FIG. 3A, weld or solder electrical connection 15 connects two successive contact metallizations 3 and 5 but, as a variation, the weld or solder connection 15 might extend all along contact metallizations 3 or 5 to connect a plurality thereof at a time. This assembly enables to stack a large number of components while being stable and compact. Indeed, whatever the number of stacked components, the largest lateral dimension of the stack does not exceed the length of the side of component 1 multiplied by the square root of two.

Figure 3B:
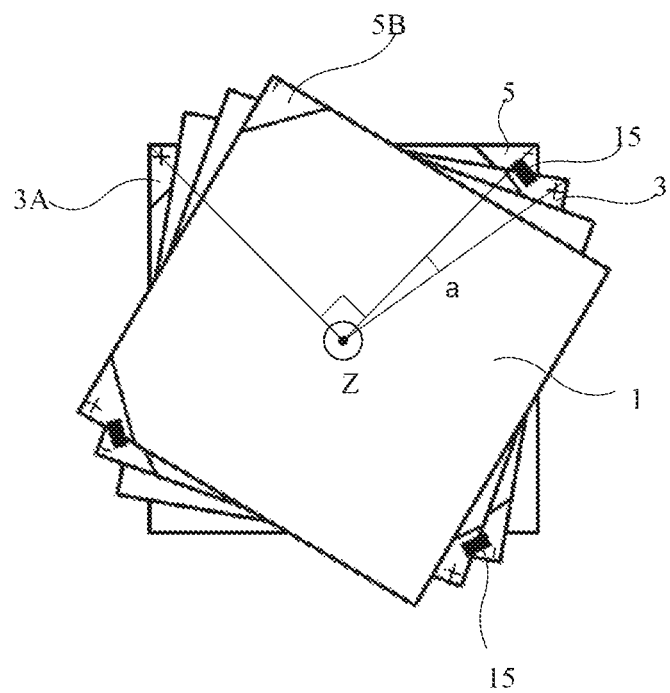
FIG. 3B is a top view of an embodiment of a series assembly of electronic components of the type in FIGS. 1A and 1B.

FIG. 3B is a top view of an embodiment of a series assembly of electronic components 1. The series assembly of electronic components 1 shown herein is similar to the parallel assembly shown in FIG. 3A, with the difference that components 1 are series-connected. To achieve this, the contact metallization 3 of a component is adjacent to the contact metallization 5 of the previous component. The components are then shifted by a 90-degree angle and then by a fixed angle "a" in the order of 10 degrees. However, in this case, only two contact metallizations 3 and 5 of successive components are adjacent and a weld or solder electrical connection 15 can only contact two adjacent contact metallizations at a time. In the illustrated example, terminal 3A of the first stacked component forms a first terminal of the series assembly and terminal 5B of the last stacked component forms the second terminal of the series assembly.

As a variation, contact metallizations 3 and 5 might be positioned on diagonal corners of a component. In this case, the parallel assembly would remain unchanged. To form a series assembly, it would be sufficient to submit each component 1 to a rotation of axis Z by a 180-degree angle followed by a rotation of axis Z by a fixed angle "a" in the order of 10 degrees.

Figure 4A:
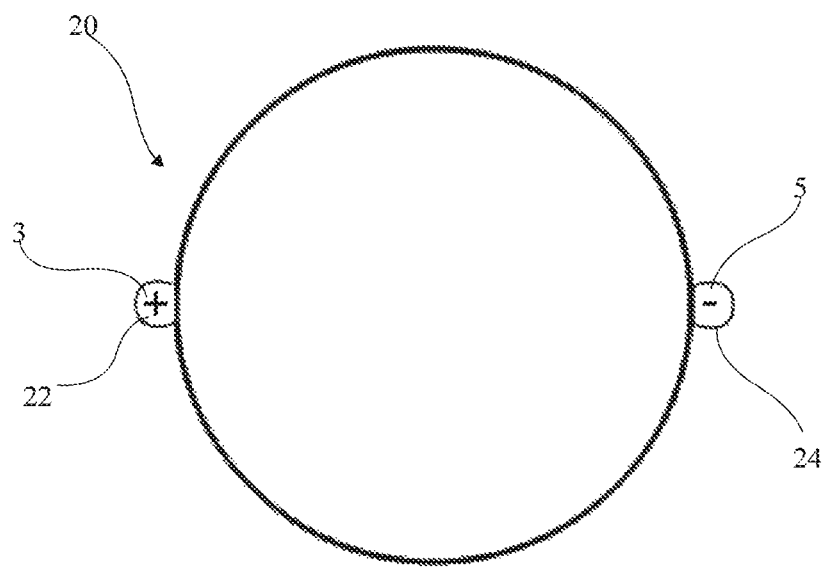
FIG. 4A is a top view of an alternative embodiment of the electronic component of the type in FIGS. 1A and 1B.

FIG. 4A is a top view of a variation 20 of the embodiment of electronic component 1 of FIGS. 1A and 1B adapted to the assemblies described in relation with FIGS. 3A and 3B. Electronic component 20 is a planar electronic component of circular shape comprising two diametrically opposite extensions 22 and 24 protruding from the periphery of component 20. The two contact metallizations 3 and 5 do not extend through the component and respectively rest on the component edge and more particularly on extensions 22 and 24. As an example, extensions 22 and 24 are oval-shaped.

Figure 4B:
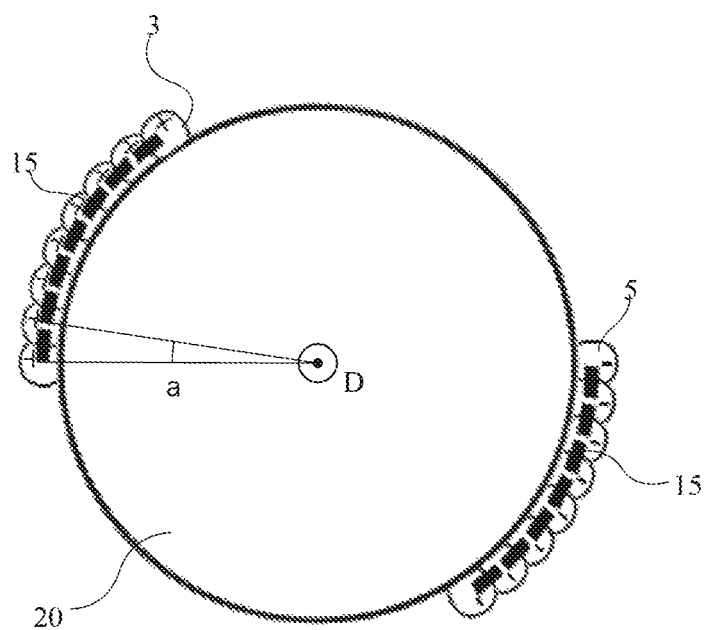
FIG. 4B is a top view of an embodiment of an assembly of electronic components of the type in FIG. 4A.

FIG. 4B is a top view of an embodiment of a parallel assembly of electronic components 20 of FIG. 4A. The assembly designated herein has the same characteristics as the assembly shown in relation with FIG. 3A. Components 20 are stacked along a common axis Z and have been submitted to a rotation about the common central axis Z by a fixed angle "a" with respect to one another. In this example, fixed angle "a" is in the order of 8 degrees. In the same way as in FIG. 3A, adjacent contact metallizations 3, 5 of the successive components 20 are connected one by one by a weld or solder electrical connection 15 but, as a variation, the weld or solder electrical connection 15 may connect a plurality of contact metallizations at a time.

It is possible to form a series assembly of electronic components 20 similar to the assembly shown in relation with FIG. 3B. To achieve this, the electronic component is submitted to a rotation around axis Z by 180 degrees in addition to the rotation of axis Z and of angle "a". In this case, the component has been submitted to a rotation of axis Z by an angle in the order of 188 degrees. The contact metallizations 3 and 5 of two successive components 20 are adjacent and may be connected by weld or solder electrical connections 15.

Figure 5A:
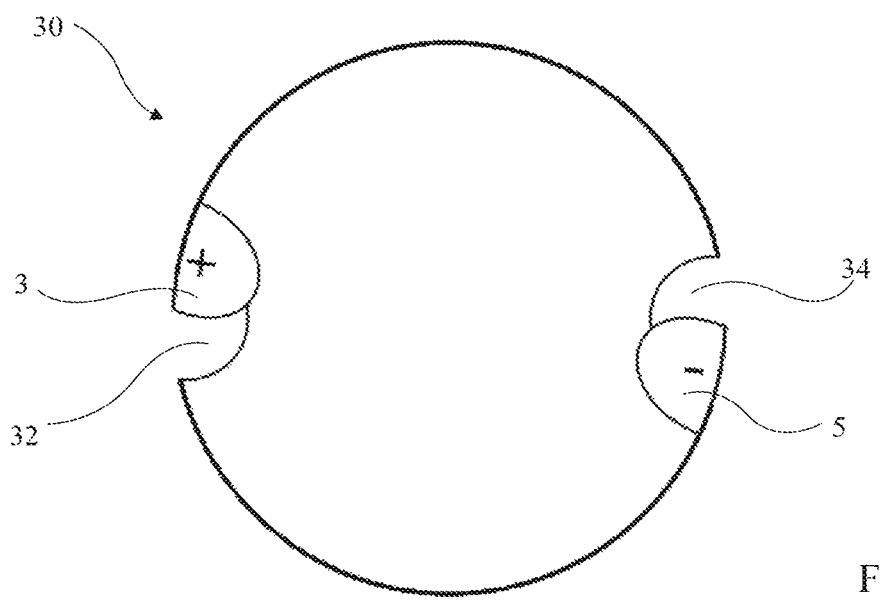
FIG. 5A is a top view of another alternative embodiment of the electronic component of the type in FIGS. 1A and 1B.

FIG. 5A is a top view of a variation 30 of the embodiment of electronic component 20 described in relation with FIG. 4A. Electronic component 30 comprises the same elements as electronic component 20 but for the fact that contact metallizations 3 and 5 are arranged inside of the circular peripheral edge of the upper surface of the component. Electronic component 30 further comprises two openings 32 and 34, each of which is adjacent to one of contact metallizations 3 or 5.

Figure 5B:
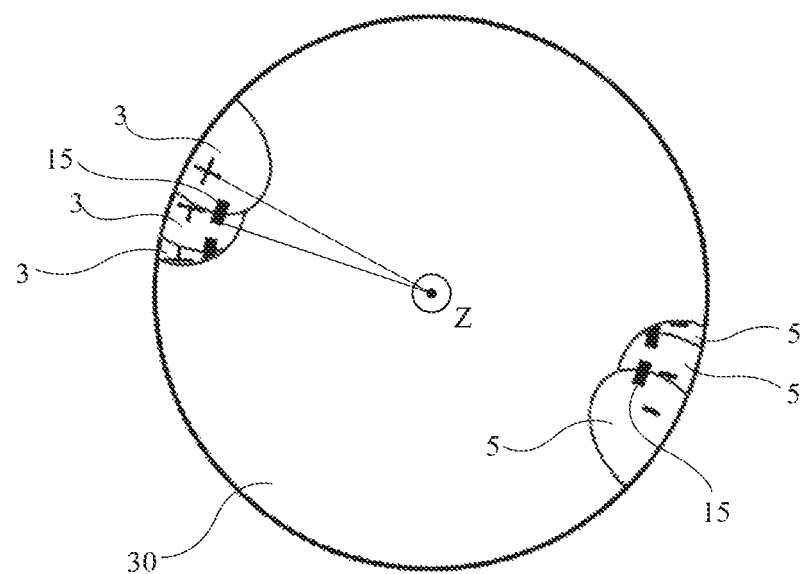
FIG. 5B is a top view of an embodiment of an assembly of electronic components of the type in FIG. 5A.

FIG. 5B is a top view of an embodiment of a parallel assembly of electronic components 30 of FIG. 5A. The assembly described herein has the same characteristics as the assembly disclosed in relation with FIG. 3A and the same elements are described with the same reference numerals. Components 30 are stacked along a common central axis Z and have been submitted to a rotation about the common central axis Z by a fixed angle "a" with respect to one another. Openings 32 and 34 enable to form the connection of contact metallization 3 of a component with contact metallization 3 of the previous component. The contact metallizations are connected by a weld or solder electrical connection 15. In this example, the size of openings 32 and 34 only enables to connect two contact metallizations at a time. As a variation, openings 32 and 34 may be enlarged to enable to connect a plurality of contact metallizations at a time.

Similarly, it is possible to form a series assembly of electronic components 30 similar to the assembly shown in relation with FIG. 3B. To achieve this, the contact metallization 5 of a component 30 and the contact metallization 3 of the previous component 30 are adjacent and the total rotation angle is in the order of 188 degrees.

An advantage of this type of assembly is to stack the electronic components with a low bulk and a great stability.

Specific embodiments have been described. Various alterations, modifications, and improvements will occur to those skilled in the art. In particular, rotation axis Z is not necessarily arranged at the center of the component but may be arranged anywhere on the component surface (for example, the axis Z may instead be positioned at a corner opposite one of the contact metallizations). Further, although the contact metallizations are here shown as having a triangular shape, the contact metallizations may extend on the corner with a different shape, such as a square or oval shape, or also the contact metallizations may be formed on a corner of a component but may not extend all the way to the edge of said component. Finally, although weld or solder electrical connections have been described, any other adapted connection means may be used, for example, connections by a cord of electrically-conductive glue or connections by metal tongues welded, soldered or attached with conductive glue.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device, comprising:
a plurality of identical planar electronic components stacked on each other along an axis Z that is orthogonal to opposed top and bottom surfaces to form an assembly, wherein the planar electronic components have a peripheral edge which in a top view facing the top surface has a circular shape,
each planar electronic component including two contact metallizations positioned inside the peripheral edge of circular shape at a same surface of the planar electronic component, and each planar electronic component including an opening extending into the planar electronic component from said peripheral edge at a location adjacent to each contact metallization,
wherein each successive planar electronic component in said assembly is rotated around the axis Z by a fixed angle relative to an adjacent planar electronic component in said assembly, the fixed angle having a value that positions, side by side, one of the contact metallizations of one planar electronic component and one of the contact metallizations of another planar electronic component adjacent said one planar electronic component, and
an electrical connection between said two side-by-side contact metallizations on adjacent planar electronic components, where each electrical connection passes through one of said openings.

2. The device of claim 1, wherein the two contact metallizations form a positive terminal and a negative terminal of a microbattery.

3. The device of claim 2, wherein the electronic components are series-connected by selecting the fixed angle to position side by side the positive terminal of a microbattery and the negative terminal of a next microbattery.

4. The device of claim 2, wherein the planar electronic components are connected in parallel by selecting the fixed angle to position side by side the positive terminal of a microbattery and the positive terminal of the next microbattery.

5. The device of claim 1, wherein the electrical connections are each formed by one of a weld or solder.

6. The device of claim 1, wherein the electrical connections each comprise a cord of an electrically-conductive glue.

* * * * *